United States Patent
Nakayama

(10) Patent No.: US 9,502,352 B2
(45) Date of Patent: Nov. 22, 2016

(54) SEMICONDUCTOR WIRING PATTERNS

(71) Applicant: Lapis Semiconductor Co., Ltd., Yokohama (JP)

(72) Inventor: Akira Nakayama, Ibaraki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/863,756

(22) Filed: Sep. 24, 2015

(65) Prior Publication Data

US 2016/0013132 A1    Jan. 14, 2016

Related U.S. Application Data

(60) Continuation of application No. 14/186,013, filed on Feb. 21, 2014, now Pat. No. 9,171,802, which is a continuation of application No. 13/404,243, filed on Feb. 24, 2012, now Pat. No. 8,698,314, which is a division of application No. 12/049,417, filed on Mar. 17, 2008, now Pat. No. 8,154,132.

(30) Foreign Application Priority Data

Aug. 31, 2007    (JP) .................................. 2007-226812

(51) Int. Cl.
    *H01L 23/48*    (2006.01)
    *H01L 23/528*   (2006.01)
    (Continued)

(52) U.S. Cl.
    CPC ......... *H01L 23/5286* (2013.01); *G09G 3/3688* (2013.01); *H01L 23/49838* (2013.01);
    (Continued)

(58) Field of Classification Search
    CPC .................... H01L 23/528; H01L 23/5286
    See application file for complete search history.

(56) References Cited

U.S. PATENT DOCUMENTS 5,252,853 A    10/1993    Michii
5,334,803 A     8/1994    Yamamura et al.
(Continued)

FOREIGN PATENT DOCUMENTS

JP        07-22469        1/1995
JP     2001176911 A       6/2001
(Continued)

OTHER PUBLICATIONS

Japanese Office Action dated Jun. 16, 2009.
(Continued)

*Primary Examiner* — Eduardo A Rodela
*Assistant Examiner* — Christopher M Roland
(74) *Attorney, Agent, or Firm* — Volentine & Whitt, PLLC

(57)    ABSTRACT

A semiconductor device includes a rectangular semiconductor element mounted on a substrate formed with an external input terminal, an external output terminal, and a plurality of wiring patterns connected to each of the external input terminal and the external output terminal. The semiconductor element includes, a plurality of first electrodes formed along a first edge of a surface thereof, a plurality of second electrodes formed along an edge opposite to the first edge of the surface, a plurality of third electrodes formed in the neighborhood of a functional block, and an internal wiring for connecting the first electrodes and the third electrodes. The substrate includes, a first wiring pattern for connecting the external input terminal and the first electrodes, a second wiring pattern for connecting the external output terminal and the second electrodes, and a third wiring pattern for connecting the first electrodes and the third electrodes.

13 Claims, 11 Drawing Sheets

(51) Int. Cl.
  *G09G 3/36* (2006.01)
  *H01L 23/498* (2006.01)
  *H01L 23/00* (2006.01)
(52) U.S. Cl.
  CPC ..... *H01L23/528* (2013.01); *G09G 2300/0426* (2013.01); *H01L 24/05* (2013.01); *H01L 24/13* (2013.01); *H01L 24/16* (2013.01); *H01L 2224/0401* (2013.01); *H01L 2224/05624* (2013.01); *H01L 2224/13144* (2013.01); *H01L 2224/16225* (2013.01); *H01L 2924/13091* (2013.01); *H01L 2924/14* (2013.01); *H01L 2924/19043* (2013.01); *H01L 2924/3011* (2013.01)

(56) References Cited

U.S. PATENT DOCUMENTS

| | | | |
|---|---|---|---|
| 5,442,233 | A | 8/1995 | Anjoh et al. |
| 5,838,070 | A | 11/1998 | Naruse et al. |
| 5,854,627 | A | 12/1998 | Kurihara et al. |
| 6,084,291 | A | 7/2000 | Fujimori |
| 6,853,430 | B2 | 2/2005 | Murahashi et al. |
| 6,867,490 | B2 | 3/2005 | Toyosawa |
| 7,902,645 | B2 | 3/2011 | Nakayama |
| 8,154,132 | B2 | 4/2012 | Nakayama |
| 8,698,314 | B2 | 4/2014 | Nakayama |
| 2002/0020899 | A1 | 2/2002 | Ohashi |
| 2003/0151578 | A1 | 8/2003 | Morita |
| 2003/0160749 | A1 | 8/2003 | Tsuchi |
| 2005/0264548 | A1 | 12/2005 | Okamura et al. |
| 2008/0043195 | A1 | 2/2008 | Shiki |
| 2009/0079047 | A1 | 3/2009 | Nakayama |
| 2011/0090005 | A1 | 4/2011 | Nakayama |

FOREIGN PATENT DOCUMENTS

| | | |
|---|---|---|
| JP | 2002124537 A | 4/2002 |
| JP | 2002244580 A | 8/2002 |
| JP | 2005107239 | 4/2005 |
| JP | 2005338421 | 12/2005 |
| JP | 2006080167 | 3/2006 |

OTHER PUBLICATIONS

U.S. Office Action in related U.S. Appl. No. 12/046,535, dated Jan. 21, 2010.
Chinese Office Action issued on Apr. 14, 2011 issued in related Chinese Application No. 200810087713.0 with English Translation.
Japanese Notice of Reasons for Rejection dated Mar. 26, 2013.
Taiwanese Office Action dated Jul. 8, 2013.

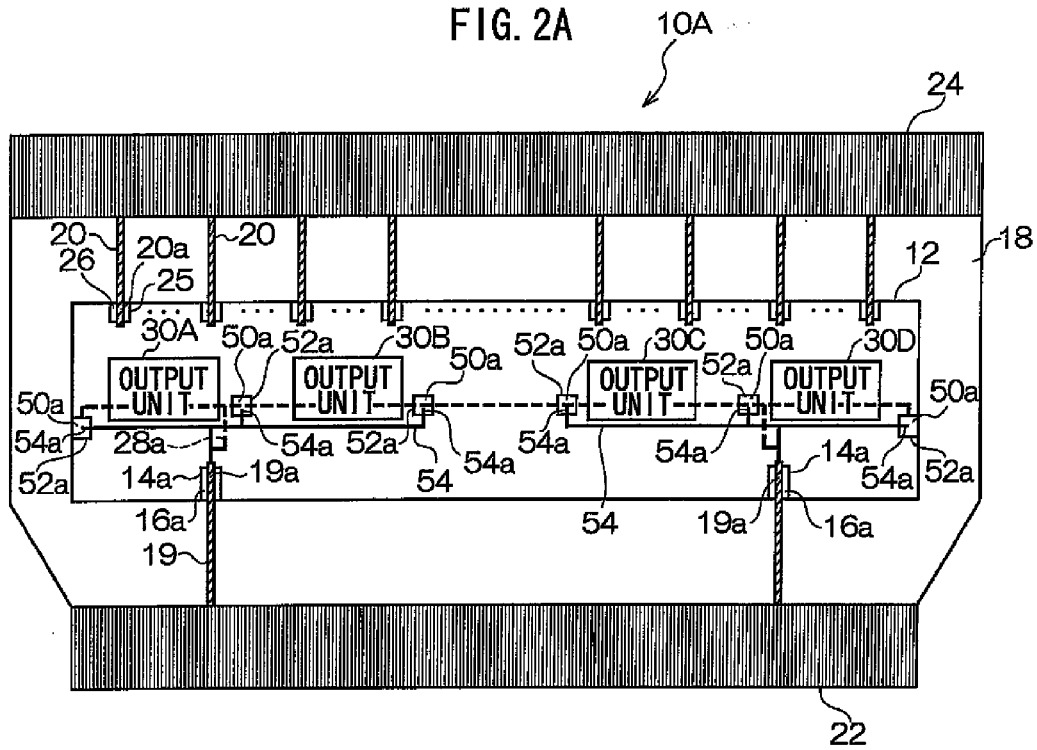
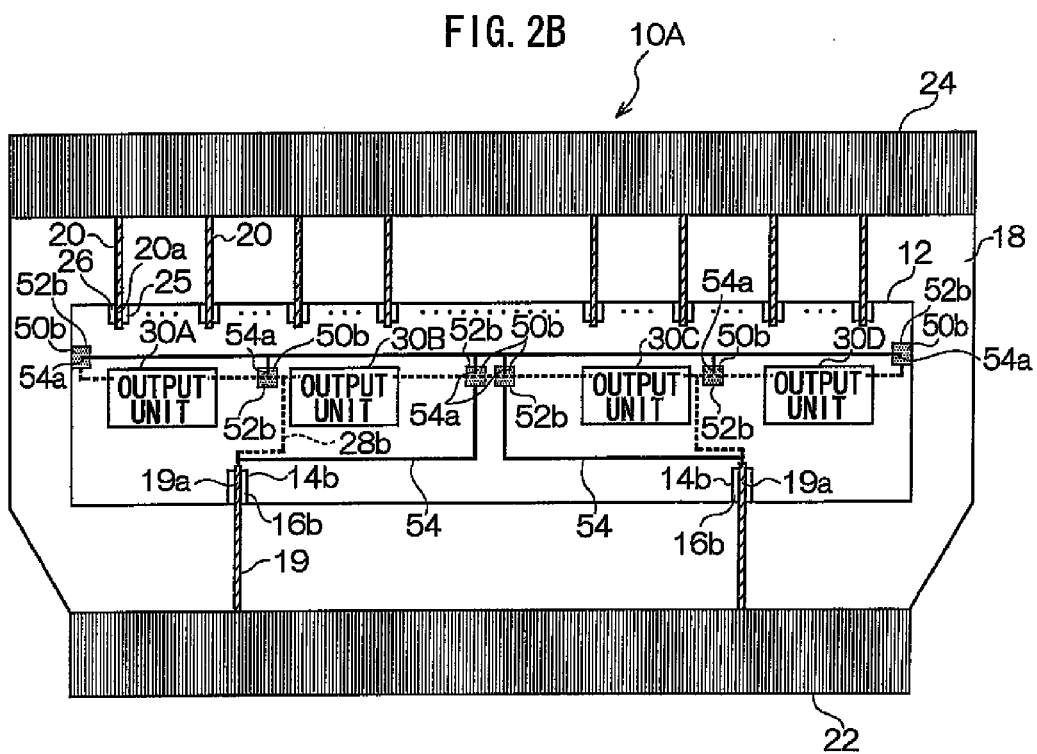

SEMICONDUCTOR WIRING PATTERNS

CROSS-REFERENCE TO RELATED APPLICATION

This application is a Continuation Application of application Ser. No. 14/186,013, filed Feb. 21, 2014, now U.S. Pat. No. 9,171,802, issued on Oct. 27, 2015, which is a Continuation Application of application Ser. No. 13/404,243, filed Feb. 24, 2012, now U.S. Pat. No. 8,698,314, issued on Apr. 15, 2014, which is a Divisional Application of application Ser. No. 12/049,417, filed Mar. 17, 2008, now U.S. Pat. No. 8,154,132, issued on Apr. 10, 2012, which claims priority under 35 USC 119 from Japanese Patent Application No. 2007-226812, the disclosure of which is incorporated by reference herein.

BACKGROUND OF THE INVENTION

1. Field of the Invention

The present invention relates to a semiconductor device and a substrate.

2. Description of the Related Art

In general, a driver to be incorporated in a liquid crystal display takes the form of a semiconductor element mounted on the display by enclosing it on a substrate constituted by tape. In a recent display driver, a D-A converter for converting a digital signal into an analog signal occupies a large percentage of the surface area of a semiconductor element as a result of the trend toward greater numbers of grayscale levels. Further, the trend toward displays having a larger size and displays incorporating a smaller number of drivers has resulted in some situations where output terminals of a quantity in excess of 720 are required per driver. In order to satisfy such a requirement, in recent drivers, a large number of wiring regions must be provided in a semiconductor element, which results in the problem that the semiconductor element will have a particularly large surface area.

Japanese Patent Application Laid-Open No. 2006-80167 addresses the problem of the increased amount of wiring in semiconductor elements and, specifically, the problem of the need to route wiring from an electrical circuit in a semiconductor element to bumps in order to extract signals from the electrical circuit. To achieve reductions in the size and weight of a semiconductor device, the document discloses a technique for connecting semiconductor element surface bumps, which serve as outputs of an electrical circuit, provided at the middle of a semiconductor element to bumps provided at a peripheral part of the semiconductor element using a wiring pattern provided on a substrate.

This technique makes it possible to connect a circuit in a semiconductor element to a wiring pattern using connection wirings. Since the connection wirings can be substituted for wirings which have been routed on or under a surface of the element, the size and weight of the semiconductor element can be reduced.

The technique disclosed in the above document allows a reduction in the amount of wiring required for output from an electrical circuit. In the case of a driver for a display, however, close attention must be paid to variations in output AC characteristics between output terminals, and it is particularly important to supply power evenly from a power supply to output units in the semiconductor element. For this reason, a power supply wiring and a ground wiring which is wired throughout the semiconductor element must be made thick enough to achieve low impedance, and the surface area of the semiconductor device is consequently increased. Therefore, reductions in the size and weight of a semiconductor element must be achieved in consideration to the above-described problems.

A driver for a display is manufactured in accordance with the layout of pins for the display (display panel) in which the driver is mounted, and the layout of pins on the semiconductor element and the layout of pins on the display does not necessarily correspond. In such a case, significant changes must be made to the existing semiconductor element.

SUMMARY OF THE INVENTION

The present invention has been made in view of the above circumstances and provides a semiconductor device and a substrate, which can be made compact and designed efficiently while maintaining the performance of a semiconductor element; in particular, the power supply capability of the element sufficiently.

A first aspect of the present invention provides a semiconductor device having a rectangular semiconductor element mounted on a substrate formed with an external input terminal, an external output terminal, and a plurality of wiring patterns connected to each of the external input terminal and the external output terminal. The semiconductor element includes a plurality of first electrodes formed along a first edge of a surface thereof, a plurality of second electrodes formed along an edge opposite to the first edge of the surface, a plurality of third electrodes formed in the neighborhood of a functional block, and an internal wiring for connecting the first electrodes and the third electrodes. The substrate includes a first wiring pattern for connecting the external input terminal and the first electrodes, a second wiring pattern for connecting the external output terminal and the second electrodes, and a third wiring pattern for connecting the first electrodes and the third electrodes.

The wording "the neighborhood of a functional block" means a position in which the functional block is closest to the third electrodes among functional blocks provided at the semiconductor element.

As thus described, in the semiconductor device of the first aspect of the invention, the third electrodes are provided in the neighborhood of a functional block of the semiconductor element in addition to the first and second electrodes which are provided also in the related art, and the third wiring pattern for connecting the first and third electrodes is provided on the substrate. Thus, functional blocks can be evenly supplied with power and, in particular, the third electrodes are provided in the neighborhood of a functional block, which must have high accuracy, and variation of characteristics as a display driver can be suppressed when the device is used as a display driver without deleting any internal wiring of the semiconductor element. Therefore, since there is no need for various adjustments to cope with variations in characteristics, design can be expedited efficiently.

A second aspect of the invention provides a substrate having a rectangular mounting region for mounting a semiconductor element and a non-mounting region defined around the mounting region, the substrate including an external input terminal provided in the non-mounting region, an external output terminal provided in the non-mounting region, a first connection node provided along a first edge of the mounting region, a second connection node provided along an edge of the mounting region opposite to the first edge, a third connection node provided at an inner side of the first connection node and the second connection node, a first wiring pattern for connecting the external input terminal and the first connection node, a second wiring pattern for connecting the external output terminal and the second connection node, and a third wiring pattern for connecting the first connection node and the third connection node.

Since the substrate in the second aspect of the invention can be used in the same manner as the substrate in the first aspect, the substrate can be used in combination with the semiconductor element in the first aspect of the invention to provide the same advantages as those of the first aspect of the invention.

BRIEF DESCRIPTION OF THE DRAWINGS

FIG. 2A is a plan view showing a configuration of a part of the semiconductor device according to the first embodiment associated with a ground wiring;

FIG. 2B is a plan view showing a configuration of a part of the semiconductor device according to the first embodiment associated with a power supply wiring;

DETAILED DESCRIPTION OF THE INVENTION

Embodiments of the invention will now be described in detail with reference to the drawings.

First Embodiment

Figure 1:
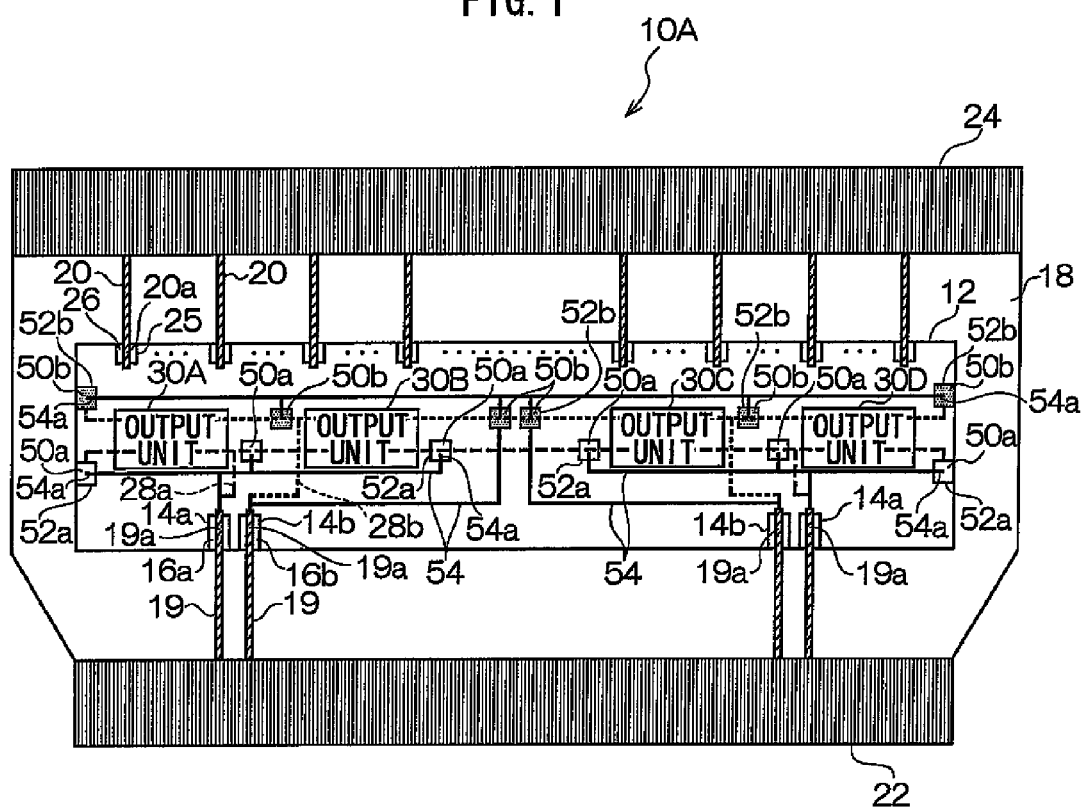
FIG. 1 is a plan view showing a general configuration of a semiconductor device according to a first embodiment of the invention.

FIGS. 1, 2A, and 2B show a configuration of a semiconductor device 10A according to the present embodiment which is fabricated as a display driver using the COF (Chip-On-Film) method. FIG. 1 is a plan view showing the configuration of the semiconductor device 10A. FIG. 2A is a plan view showing a configuration of a part of the semiconductor device 10A associated with a ground wiring of the same. FIG. 2B is a plan view showing a configuration of a part of the semiconductor device 10A associated with a power supply wiring of the same.

As shown in FIGS. 1, 2A, and 2B, the semiconductor device 10A includes a semiconductor element 12 configured as an IC (integrated circuit) chip and an insulating film 18 constituted by a film (tape) serving as a substrate, and the device is formed by mounting the semiconductor element 12 on the insulating film 18.

The substantially rectangular semiconductor element 12 has ground terminal electrodes (aluminum pads) 14a which are electrodes for inputting a ground level formed along a first edge of a surface of the semiconductor element 12, Au (gold) bumps 16a provided on surfaces of the ground terminal electrodes 14a, power supply terminal electrodes (aluminum pads) 14b which are electrodes for power supply input formed along the first edge of the semiconductor element 12, and Au bumps 16b provided on surfaces of the power supply electrodes 14b. The ground terminal electrodes 14a and the power supply terminal electrodes 14b are referred to using a general term "first electrodes 14". The semiconductor element 12 also has driver output terminal electrodes (aluminum pads) 25 which are electrodes for outputting signals formed along an edge opposite to the first edge of the semiconductor element 12, Au bumps 26 provided on surfaces of the driver output terminal electrodes 25, a semiconductor element internal ground wiring 28a, a semiconductor element internal power supply wiring 28b, and semiconductor element internal output units 30A to 30D which are formed along the edge opposite to the first edge and output respective predetermined signals for driving the display. The semiconductor element internal ground wiring 28a and the semiconductor element internal power supply wiring 28b are referred to using a general term "internal power supply wirings 28. The driver output terminal electrodes 25 are also referred to as "second electrodes 25". The semiconductor element internal ground wiring 28a and the semiconductor element internal power supply wiring 28b are provided throughout the semiconductor element 12, and they extend along the edge opposite to the first edge in the neighborhood of semiconductor element internal output units 30.

The insulating film 18 has a mounting region which is defined to allow the semiconductor element 12 to be mounted and a non-mounting region which is defined around the mounting region. Since the semiconductor element 12 is rectangular, the mounting region defined thereon is also rectangular. Particularly, when the element is a driver IC, it has a rectangular shape in most cases, and the direction of the longer sides of the element is therefore defined to be the longitudinal direction thereof.

In the non-mounting region of the insulating film 18, input side outer leads (external input terminals) 22 are formed to allow signals from a control IC (e.g., a timing controller) for controlling the driver IC to be input, and output side outer leads (external output terminals) 24 are also formed such that they are mounted in a display (LCD panel or the like) to allow signals to be output to the same.

In the mounting region of the insulating film 18, first connection nodes 19a, second connection nodes 20a, and third connection nodes 54a are formed.

The first connection nodes 19a are provided along the first edge which is defined in the rectangular mounting region. The second connection nodes 20a are provided along the edge opposite to the first edge. Further, the third connection nodes 54*a* are provided in the mounting region at an inner side of the first connection nodes 19*a* and the second connection nodes 20*a*. In the present embodiment, it may be stated that the third connection nodes 54*a* is formed in the neighborhood of the second connection nodes 20*a*.

Further, metal wiring patterns (first to third connection patterns) 19, 20, and 54 are formed on the insulating film 18. The metal wiring patterns 19 connect the first connection nodes 19*a* and the input side outer leads 22. The metal wiring patterns 20 connect the second connection nodes 20*a* and the output side outer leads 24. The metal wiring patterns 54 connect the first connection nodes 19*a* and the third connection nodes 54*a*. The outer leads, the metal wiring patterns, and the connection nodes are integrally formed as occasion demands.

The Au bumps 16*a*, 16*b*, and 26 are provided on the electrodes 14*a*, 14*b*, and 26*b* which are provided along the periphery of the semiconductor element 12. When the semiconductor element 12 is mounted on the insulating film 18, the Au bumps 16*a* and 16*b* are electrically connected to the input side outer leads 22 through the metal wiring patterns 19 and the first connection nodes 19*a* provided at parts of the metal wiring patterns 19, and the Au bumps 26 are electrically connected to the output side outer leads 24 through the metal wiring patterns 20 and the second connection nodes 20 provided at parts of the metal wiring patterns 20. The first connection nodes 19*a* are electrically connected to the Au bumps provided on the semiconductor element 12 and the terminal electrodes where the Au bumps are provided as thus described. Therefore, the connection nodes are formed in the mounting region and are electrically connected to the semiconductor element internal ground wiring 28*a* or the semiconductor element internal power supply wiring 28*b*.

The terminal electrode provided under each Au bump of the semiconductor element 12 is electrically connected to an internal circuit of the semiconductor element 12 through an internal wiring of the semiconductor element 12.

The ground terminal electrodes 14*a* and the power supply terminal electrodes 14*b* are electrically connected to the semiconductor element internal ground wiring 28*a* and the semiconductor element internal power supply wiring 28*b*, respectively. As a result, the semiconductor element internal ground wiring 28*a* and the semiconductor element internal power supply wiring 28*b* are electrically connected to the input side outer leads 22 through the first connection nodes 20*a* and the metal wiring patterns 20.

Signals are input to the semiconductor device 10A through the input side outer leads 22 and are subjected to predetermined conversion in the semiconductor element 12, and the converted signals are output through the output side outer leads 24. In order to avoid confusion, FIGS. 1, 2A, and 2B show only the semiconductor element internal output units 30A to 30D among internal circuits (functional blocks) of the semiconductor element 12, and other internal circuits (such as a logic unit, a level conversion unit, a latch unit, a D-A conversion unit, and a grayscale voltage generating unit) are omitted in the figures.

In general, the semiconductor element internal output units 30A to 30D include operational amplifiers as primary components. The output units may be hereinafter referred to using a general term "semiconductor element internal output units 30", and the semiconductor element internal output units 30 will now be described.

In general, the semiconductor element internal output unit 30 is provided with operational amplifiers in a quantity equal to or larger than the number of the driver output terminal electrodes 25 associated with the unit. Since there are a great number of driver output terminal electrodes 25, several divisions or blocks such as the semiconductor element internal output units 30A to 30D are provided for reasons associated with designing. In the case of a driver IC having outputs to be provided over 720 channels, since the element has four divisions, operational amplifiers corresponding to 180 channels are provided at the semiconductor element internal output unit 30A. When positive and negative electrodes are to be driven by separate operational amplifiers, operational amplifiers may be formed in a quantity which is several times the number of channels. In this case, the set of operational amplifiers is represented as one output unit. The semiconductor element internal output units 30 are provided in the neighborhood of the driver output terminal electrodes 25.

The semiconductor element internal output unit 30B and the semiconductor element internal output unit 30C are spaced from each other at a distance larger than distances between other combinations of the semiconductor element internal output units 30, and various functional blocks including a grayscale voltage generation circuit are disposed in the space.

The semiconductor element 12 of the present embodiment includes the ground terminal electrodes 52*a* and the power supply terminal electrodes 52*b* which are formed on a surface of the element and in the neighborhood of the semiconductor element internal output units 30A to 30D. Semiconductor element surface Au bumps 50*a* for grounding are formed on the ground terminal electrodes 52*a*, and semiconductor element surface Au bumps 50*b* for power supply are formed on the power supply terminal electrodes 52*b*. The ground terminal electrodes 52*a* and the power supply terminal electrodes 52*b* may be hereinafter referred to using a general term "third electrodes 52". The wording "in the neighborhood of the semiconductor element internal output units" means that the electrodes are in positions where the functional blocks nearest to the electrodes are the semiconductor element internal output units or that the electrodes are located around the semiconductor element internal output units.

It may be alternatively put that the third electrodes 52 are provided in the neighborhood of the driver output terminal electrodes 25. In other words, the third electrodes 52 are provided around the semiconductor element internal output units 30. The third electrodes 52 may alternatively be provided between the blocks constituted by the semiconductor element internal output unit 30A and the semiconductor element internal output unit 30B. It is preferable to provide a plurality of the third electrodes 52. Common connection is provided between the plurality of third electrodes 52, i.e., between the ground terminal electrodes 52*a* or between the power supply terminal electrodes 52*b* by the respective metal wiring patterns 54. A plurality of the third electrodes 52 are provided at positions such as a central part of the semiconductor element 12, the gaps between the blocks constituted by the output units 30, and the neighborhood of the side edges of the surface of the semiconductor element 12, the side edges being the shorter sides of the surface. The third electrodes are preferably provided on each of the left and right longitudinal ends of the semiconductor element 12.

The metal wiring patterns 54 connected to common as described above include parts which are disposed to extend straightly in the longitudinal direction of the element. The metal wiring pattern 54 for common connection between the ground terminal electrodes 52*a* and the metal wiring pattern 54 for common connection between the power supply terminal electrodes 52b are disposed so as to sandwich the semiconductor element internal output units 30. In other words, the output units 30 are located at intervals between the metal wiring pattern 54 for common connection between the ground terminal electrodes 52a and the metal wiring pattern 54 for common connection between the power supply terminal electrodes 52b. Further, the metal wiring patterns 54 used for common connection are disposed in the neighborhood of the semiconductor element internal ground wiring 28a and the semiconductor element internal power supply wiring 28b. The semiconductor element internal ground wiring 28a and the semiconductor element internal power supply wiring 28b are also provided to extend in the longitudinal direction of the element.

The plural ground terminal electrode 14a and the plural power supply terminal electrode 14b, which are the first electrodes, are provided along the first side of the semiconductor element 12. In other words, in the longitudinal direction, the ground terminal electrode 14a and the power supply terminal electrode 14b are respectively provided on the left and right portions divided along the first side. Here, the power supply terminal electrodes 14b are disposed closer to the center than the ground terminal electrodes 14a. Also, the metal wiring patterns 54 connected to the power supply terminal electrodes 14b are connected to the metal wiring pattern 54 for common connection between the power supply terminal electrodes 52b via the vicinity of the center portion of the semiconductor element 12.

The ground terminal electrodes 14a and the ground terminal electrodes 52a are connected by the semiconductor element internal ground wiring 28a, and the power supply terminal electrodes 14b and the power supply terminal electrodes 52b are connected by the semiconductor element internal power supply wiring 28b.

The insulating film 18 includes metal wiring patterns 54 formed thereon for electrically connecting the Au bumps 16a of the semiconductor element 12 and the semiconductor element surface Au bumps 50a for grounding and for electrically connecting the Au bumps 16a and the semiconductor element surface Au bumps 50b for power supply when the semiconductor element 12 is mounted on the film. Therefore, when the semiconductor element 12 is mounted on the insulating film 18, the third connection nodes 54a provided at parts of the metal wiring patterns 54 is electrically connected to the ground terminal electrodes 52a or the power supply electrode terminals 52b. As a result, electrical connection is established between the ground terminal electrodes 14a and the ground terminal electrodes 52a and between the power supply terminal electrodes 14b and the power supply terminal electrodes 52b. In general, since the metal wiring patterns 54 are formed from a conductive material having a relatively high electrical conductivity such as Cu (copper), resistance provided by the metal wiring patterns 54 is much smaller than that provided by aluminum formed at an inner side of the semiconductor element.

The manufacture of the semiconductor device 10A of the present embodiment will not be described because it can be manufactured using techniques known in the related art including the techniques disclosed in Patent Document 1 by way of example.

In the present embodiment, as thus described, the third electrodes 52 are disposed in the neighborhood of the functional blocks of the semiconductor element 12; the metal wiring patterns 19 and the metal wiring patterns 54 are provided in connection with the input side outer leads 22 provided on the insulating film 18 serving as a substrate; and the metal wiring patterns 54 and the third electrodes 52 are connected. Thus, power can be evenly supplied to the functional blocks. In particular, the third electrodes 52 are disposed in the neighborhood of the semiconductor element internal output units 30 which must have high accuracy, and the third electrodes 52 and the internal power supply wirings 28 are connected. It is therefore possible to maintain paths for supplying power from the first electrodes 14 to the output units 30 through the internal power supply wirings 28 and paths for supplying power from the third electrodes 52 to the output units 30 through the internal power supply wirings 28. Even when the area occupied by the internal power supply wirings 28 is reduced, resistance can be kept substantially unchanged or reduced. Thus, the semiconductor element 12 can be provided with a small surface area by keeping the area of the internal power wirings 28 small, and the performance of the semiconductor element 12 can be satisfactorily kept. The amount of heat generated can be kept small by a substantial reduction in the resistance of the internal power supply wirings 28.

Since the power supply wirings in the semiconductor element 12 are used without any deletion to achieve the above-described effect, it is possible to suppress any variation in characteristics which can otherwise occur when the element is used as a display driver. Thus, there is no need for various adjustments which are otherwise required to cope with such variation in characteristics, which allows designing to be efficiently carried out.

The metal wiring patterns 54 connected to the power supply terminal electrodes 52b are disposed in the neighborhood of the driver output terminal electrodes 25 and also in the neighborhood of the semiconductor element internal output units 30, fluctuation of the power supply voltage can be suppressed more efficiently. The above-described feature is provided at each of the left and right sides of the semiconductor element 12, and the features are connected to common to allow the resistance of the internal power supply wirings 28 to be reduced further, which enhances the effect of supplying electric power evenly. The present mode for carrying out the invention is made possible by providing the metal wiring patterns 54 so as to extend through the central part of the semiconductor element 12. Further, since the third electrodes 52 are provided in the neighborhood of the semiconductor element internal output units 30 and are connected to each other by the metal wiring patterns 54, the electrodes are expected to play the role of conducting heat from the semiconductor element internal output units 30 which are a source of an especially large amount of heat.

The use of the insulating film 18 having the configuration in the present embodiment allows designing to be carried out efficiently.

Second Embodiment

Figure 3:
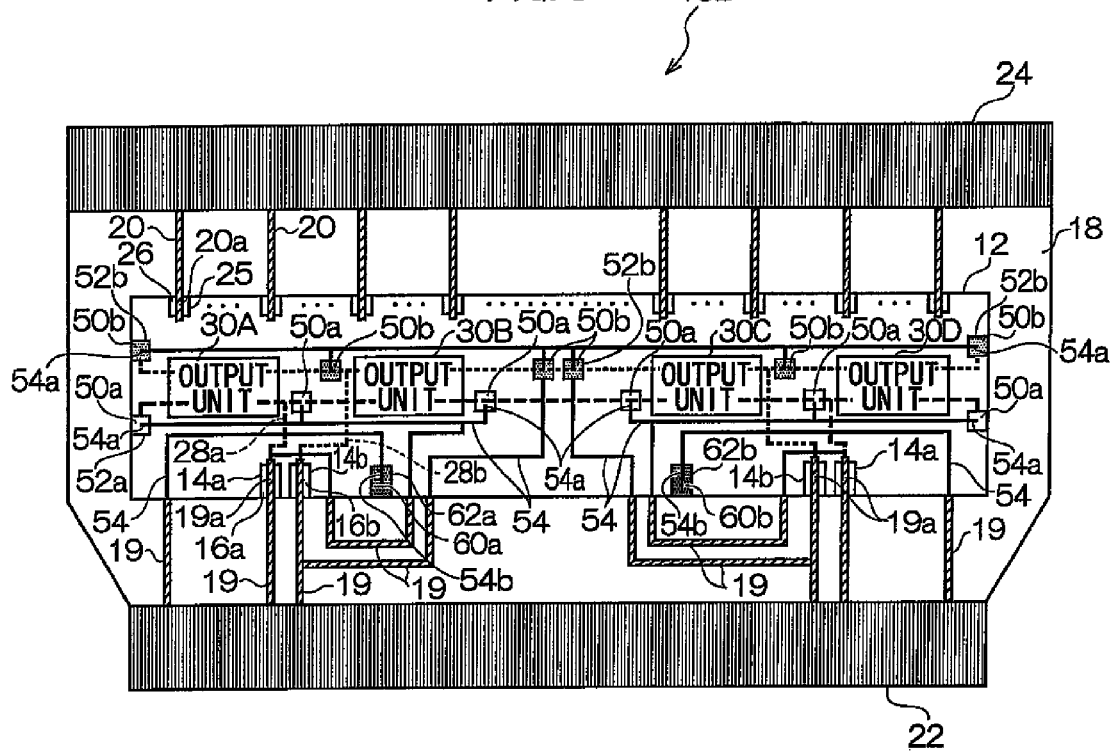
FIG. 3 is a plan view showing a general configuration of a semiconductor device according to a second embodiment of the invention.
Figure 4A:
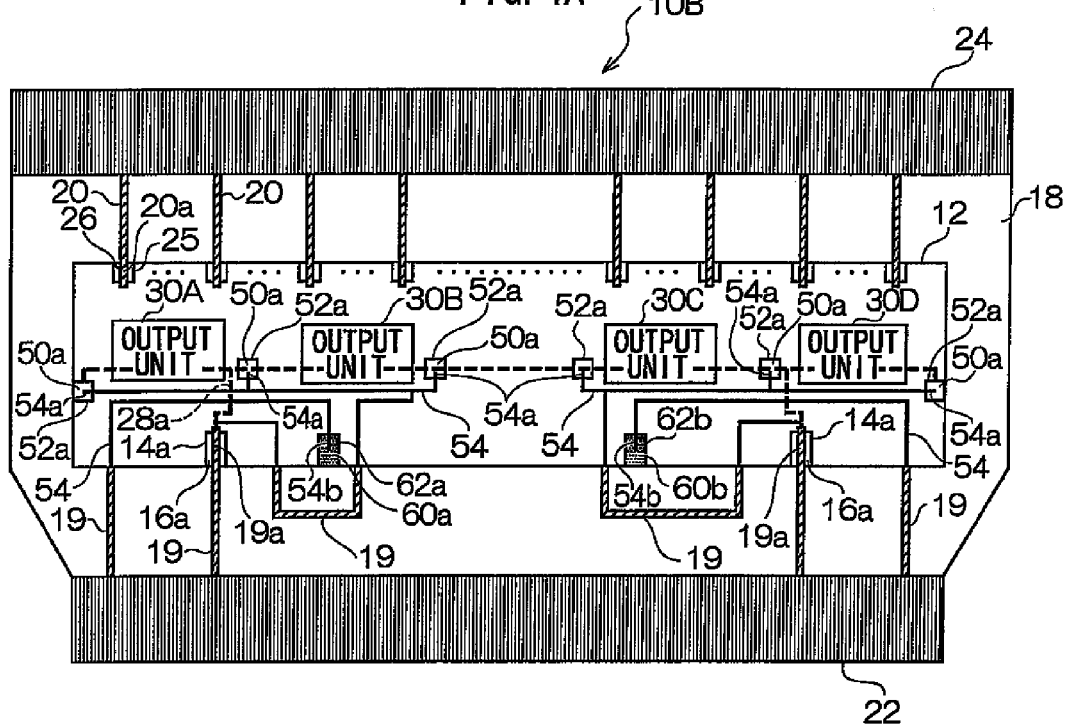
FIG. 4A is a plan view showing a configuration of a part of the semiconductor device according to the second embodiment associated with a ground wiring.
Figure 4B:
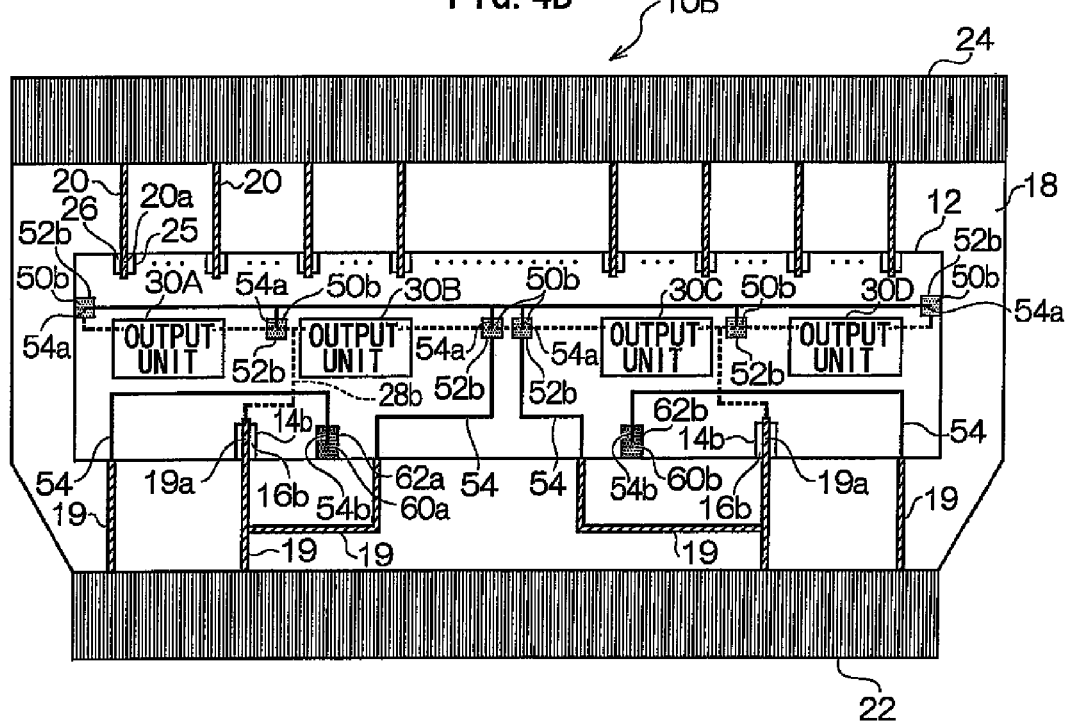
FIG. 4B is a plan view showing a configuration of a part of the semiconductor device according to the second embodiment associated with a power supply wiring.

FIGS. 3, 4A, and 4B show a configuration of a semiconductor device 10B according to a second embodiment of the invention fabricated as a display driver using the COF method. FIG. 3 is a plan view showing the configuration of the semiconductor device 10B. FIG. 4A is a plan view showing a configuration of a part of the semiconductor device 10B associated with a ground wiring of the same. FIG. 4B is a plan view showing a configuration of a part of the semiconductor device 10B associated with a power supply wiring of the same. Components identical between FIGS. 3, 4A, 4B and FIGS. 1, 2A, 2B are indicated by reference numerals used in FIGS. 1, 2A, and 2B and will not be described here.

The semiconductor element 10B has a first connection terminal 62a and a second connection terminal 62b which are electrodes for signal input formed along a first edge of a semiconductor element 12, an Au (gold) bump 60a provided on a surface of the first connection terminal 62a, and an Au (gold) bump 60b provided on a surface of the second connection terminal 62b. The first connection terminal 62a and the second connection terminal 62b are provided in the neighborhood of power supply terminal electrodes 14b.

Connection nodes 54b for signal input are formed in a mounting region on an insulating film 18. The connection nodes 54b for signal input are provided along the first edge of the element.

Further, metal wiring patterns 19 and metal wiring patterns 54 for connecting the connection nodes 54b for signal input and outer leads 22 for input are formed on the insulating film 18. The input outer leads 22, the metal wiring patterns, and the connection nodes 54b for signal input may be integrally formed as occasion demands.

The Au bump 60a and the Au bump 60b are provided on the first connection terminal 62a and the second connection terminal 62b provided along the periphery of the semiconductor element 12. When the semiconductor element 12 is mounted on the insulating film 18, the bumps are electrically connected to the input side outer leads 22 through the metal wiring patterns 19, the metal wiring patterns 54, and the connection nodes 54b for signal input provided at parts of the metal wiring patterns 54. As thus described, the connection nodes 54b for signal input are electrically connected to the Au bumps 60a and 60b provided at the semiconductor element 12 and the first connection terminal 62a and the second connection terminal 62b on which the Au bumps are provided, and the connection nodes are therefore formed in the mounting region.

In the semiconductor element 12, the first connection terminal 62a and the second connection terminal 62b provided under the An bumps 60a and 60b, respectively are electrically connected to internal circuits of the semiconductor element 12 through internal wirings of the semiconductor element 12.

In the semiconductor device 10B, metal wiring pattern 19 and metal wiring pattern 54 (hereinafter referred to as "left side input signal wiring patterns") for connecting the connection nodes 54b for signal input and the input outer leads 22, the first connection terminal 62a, ground terminal electrodes 52a, and power supply terminal electrodes 52b are disposed on the left side of a central part of the semiconductor element when viewed in the longitudinal direction of the element. Metal wiring pattern 19 and metal wiring pattern 54 (hereinafter referred to as "right side input signal wiring patterns") for connecting the connection nodes 54b for signal input and the input outer leads 22, the second connection terminal 62a, ground terminal electrodes 52a, and power supply terminal electrodes 52b are disposed on the right side of the central part of the semiconductor element in the longitudinal direction thereof.

On the insulating film 18, the left side input signal wiring patterns and the metal wiring patterns connecting the input outer leads 22 and the ground terminal electrode 14a and the power supply terminal electrode 14b located on the left side of the element in the longitudinal direction thereof are disposed in line with each other, and the left side input signal wiring patterns are disposed outside (on the left of) the metal wiring patterns connecting the input outer leads 22 with the ground terminal electrode 14a and the power supply terminal electrode 14b located on the left side of the element in the longitudinal direction thereof. The right side input signal wiring patterns and the metal wiring patterns connecting the input outer leads 22 and the ground terminal electrode 14a and the power supply terminal electrode 14b located on the right side of the element in the longitudinal direction thereof are disposed in line with each other, and the right side input signal wiring patterns are disposed outside (on the right of) the metal wiring patterns connecting the input outer leads 22 with the ground terminal electrode 14a and the power supply terminal electrode 14b located on the right side of the element in the longitudinal direction thereof.

Both of the first connection terminal 62a and the second connection terminal 62b are disposed on the first edge closer to the central part than the ground terminal electrode 14a and the power supply terminal electrode 14b are. The left side input signal wiring patterns are disposed outside (on the left of) the ground terminal electrode 14a and the power supply terminal electrode 14b on the left side of the element in the longitudinal direction thereof with respect to the first edge. The right side input signal wiring patterns are disposed outside (on the right of) the ground terminal electrode 14a and the power supply terminal electrode 14b on the right side of the element in the longitudinal direction thereof with respect to the first edge.

On the insulating film 18, the metal wiring pattern connecting the ground terminal electrode 14a and the ground terminal electrode 52a on the left side of the element in the longitudinal direction thereof (hereinafter referred to as "left side ground wiring pattern") and the metal wiring pattern connecting the power supply terminal electrode 14b and the power supply terminal electrode 52b on the left side of the element in the longitudinal direction thereof (hereinafter referred to as "left side power supply wiring pattern") are disposed so as to detour around the left side input signal wiring patterns. The metal wiring pattern connecting the ground terminal electrode 14a and the ground terminal electrode 52a on the right side of the element in the longitudinal direction thereof (hereinafter referred to as "right side ground wiring pattern") and the metal wiring pattern connecting the power supply terminal electrode 14b and the power supply terminal electrode 52b on the right side of the element in the longitudinal direction thereof (hereinafter referred to as "right side power supply wiring pattern") are disposed so as to detour around the right side input signal wiring patterns.

On the insulation film 18, adjustment is made to make impedance provided by the left side ground wiring pattern and the left side power supply wiring pattern and impedance provided by the right side ground wiring pattern and the right side power supply wiring pattern equal to each other.

As shown in FIGS. 3 and 4B, the metal wiring pattern 19 and the metal wiring pattern 54 constituting the left side power supply wiring pattern and the metal wiring pattern 19 and the metal wiring pattern 54 constituting the right side power supply wiring pattern are integrally formed in part and are connected to the power supply terminal electrodes 52b through the non-mounting region.

In addition to the advantage of the first embodiment, when the configuration of the present embodiment as thus described is used, any difference between the pin layout of an existing driver IC and the pin layout of a panel to which the IC is to be mounted can be handled by designing the substrate appropriately. In other words, the time required for designing the layout of the semiconductor element 12 can be made much shorter than that required in the related art. In particular, the left side ground wiring pattern and the left side power supply wiring pattern detour around the first connection terminal 62a and the left side input signal wiring patterns, and the right side ground wiring pattern and the right side power supply wiring pattern detour around the second connection terminal 62b and the right side input signal wiring patterns. Thus, connection can be established between the ground terminal electrodes 52a and the power supply terminal electrodes 52b. Since impedance provided by the left side ground wiring pattern and the left side power supply wiring pattern and impedance provided by the right side ground wiring pattern and the right side power supply wiring pattern are made equal, power can be evenly supplied to the left and right sides of the semiconductor element 12 to allow a further reduction of variation in power between pins.

Third Embodiment

Figure 5:
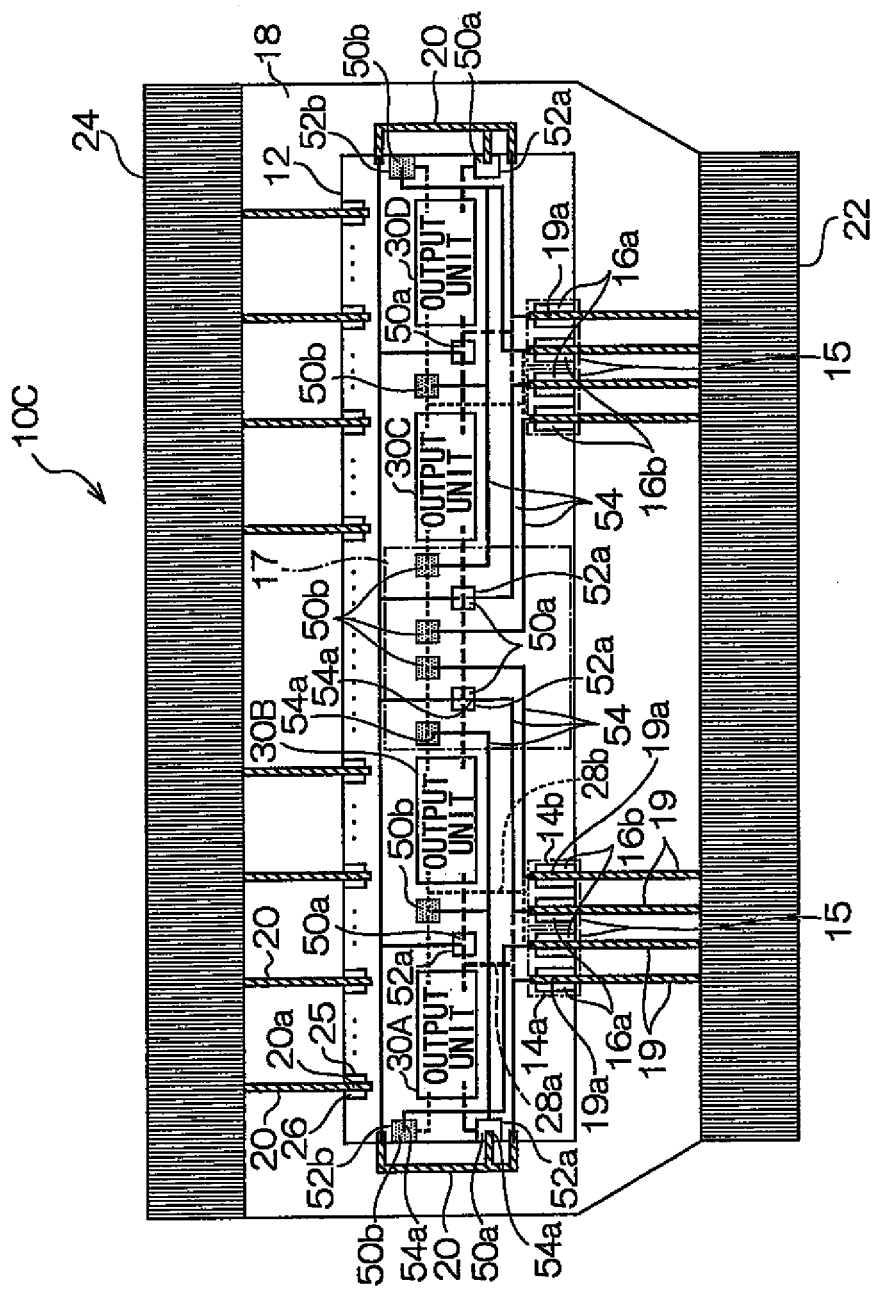
FIG. 5 is a plan view showing a general configuration of a semiconductor device according to a third embodiment of the invention.
Figure 6A:
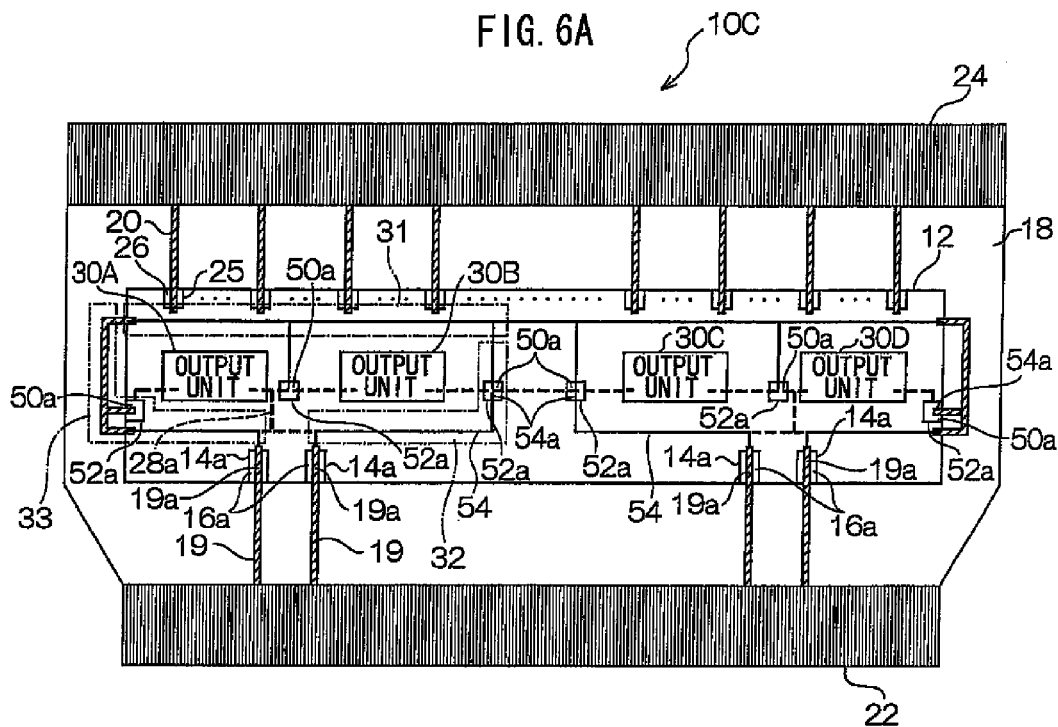
FIG. 6A is a plan view showing a configuration of a part of the semiconductor device according to the third embodiment associated with a ground wiring.
Figure 6B:
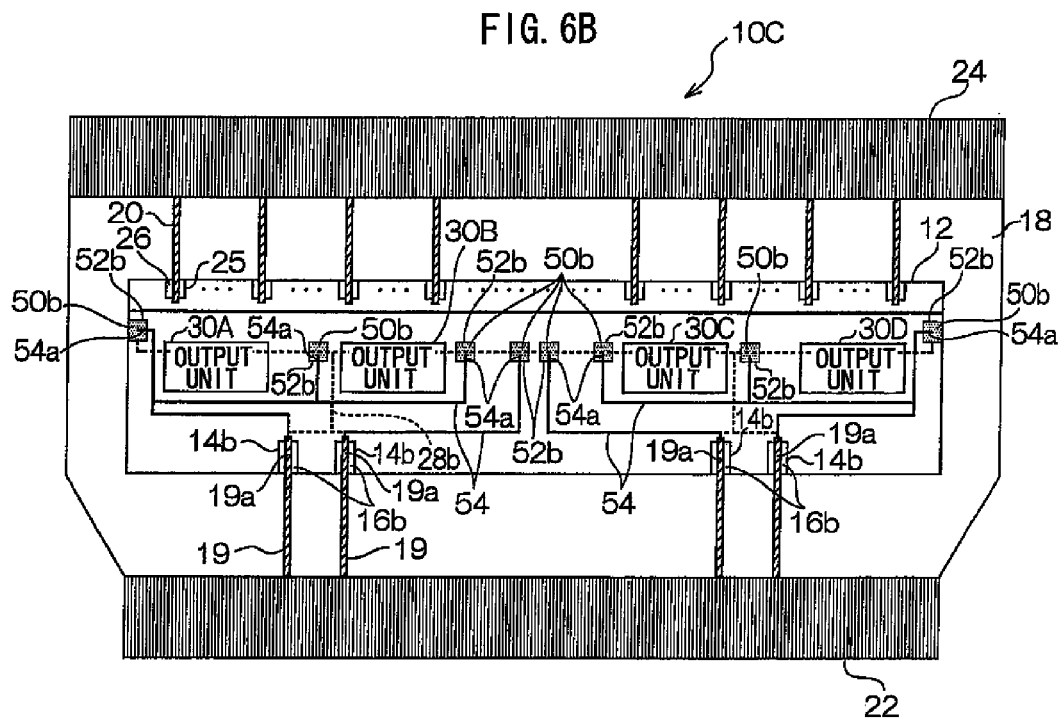
FIG. 6B is a plan view showing a configuration of a part of the semiconductor device according to the third embodiment associated with a power supply wiring.

FIGS. 5, 6A, and 6B show a configuration of a semiconductor device 10C according to a third embodiment of the invention fabricated as a display driver using the COF method. FIG. 5 is a plan view showing the configuration of the semiconductor device 10C. FIG. 6A is a plan view showing a configuration of a part of the semiconductor device 10C associated with a ground wiring of the same. FIG. 6B is a plan view showing a configuration of a part of the semiconductor device 10C associated with a power supply wiring of the same. Components identical between FIGS. 5, 6A, 6B and FIGS. 1, 2A, 2B are indicated by reference numerals used in FIGS. 1, 2A, and 2B and will not be described here.

In the semiconductor device 10C of the present embodiment, ground terminal electrodes 14a and power supply terminal electrodes 14b are alternately disposed along a first edge of the same. Specifically, the ground terminal electrodes 14a and the power supply terminal electrodes 14b are disposed to form pairs of adjoining electrodes. Let us assume that a ground terminal electrode 14a and a power supply terminal electrode 14b disposed adjacent to each other constitute one power supply electrode pair 15. Then, two power supply electrode pairs 15 are disposed on each of the left and right sides of a central part of the first edge. Referring to the disposition of each set of ground terminal electrode 14a and power supply terminal electrode 14b, the power supply terminal electrode 14b is located closer to the central part of the first edge than the ground terminal electrode 14a is. Another electrode may be formed between each of the two power supply electrode pairs 15 on the left and right sides. For example, an electrode to which a reference voltage is input may be formed.

On an insulating film 18 of the present embodiment, a metal wiring pattern for connecting the ground terminal electrodes 14a and ground terminal electrodes 52a is disposed so as to surround the peripheries of semiconductor element internal output units 30, and a metal wiring pattern for connecting the power supply terminal electrodes 14b and power supply electrode terminals 52b is disposed so as to surround the peripheries of the semiconductor element internal output units 30. Specifically, each of the metal wiring patterns is formed by three parts in the left and right sides of a semiconductor element 12 in the longitudinal direction thereof. The left part of the semiconductor element 12 will be described by way of example. The metal wiring pattern in this part is a metal wiring pattern 54 having a first part 31 formed between second electrodes 25 and third electrodes 52 and in the neighborhood of the second electrodes 25 so as to straightly extend in the longitudinal direction of the element, a second part 32 connecting the ground terminal electrode 14a of one of the two power supply electrode pairs 15 disposed on the left side of the semiconductor element 12 in the longitudinal direction thereof, the electrode pair 15 being closer to a central part 17 of the first edge than the other, to the first part 31 by extending through the central part 17 of the semiconductor element 12, and a third part 33 connecting the ground terminal electrode 14a of the other of the two power supply electrode pairs 15 disposed on the left side of the semiconductor element 12 in the longitudinal direction thereof to the first part 31 by extending from the mounting region through the non-mounting region. The first, second, and third parts are disposed to surround the peripheries of the output units 30 when combined. The right part of the semiconductor element 12 has similar three parts, and the left and right first parts 31 are connected to common.

In the present embodiment, the same advantages as in the first embodiment can be achieved even in the case of a pin layout in which two power supply electrode pairs are provided on each of the left and right sides of the semiconductor element 12. The metal wiring patterns connecting the ground terminal electrodes 14a and the ground terminal electrodes 52a are disposed to surround the peripheries of the semiconductor element internal output units 30, and the metal wiring patterns connecting the power supply terminal electrodes 14b and the power supply terminal electrodes 52b are also disposed to surround the peripheries of the semiconductor element internal output units 30. Therefore, power can be evenly supplied, and a further reduction can be achieved in variation of power between pins.

Fourth Embodiment

Figure 7:
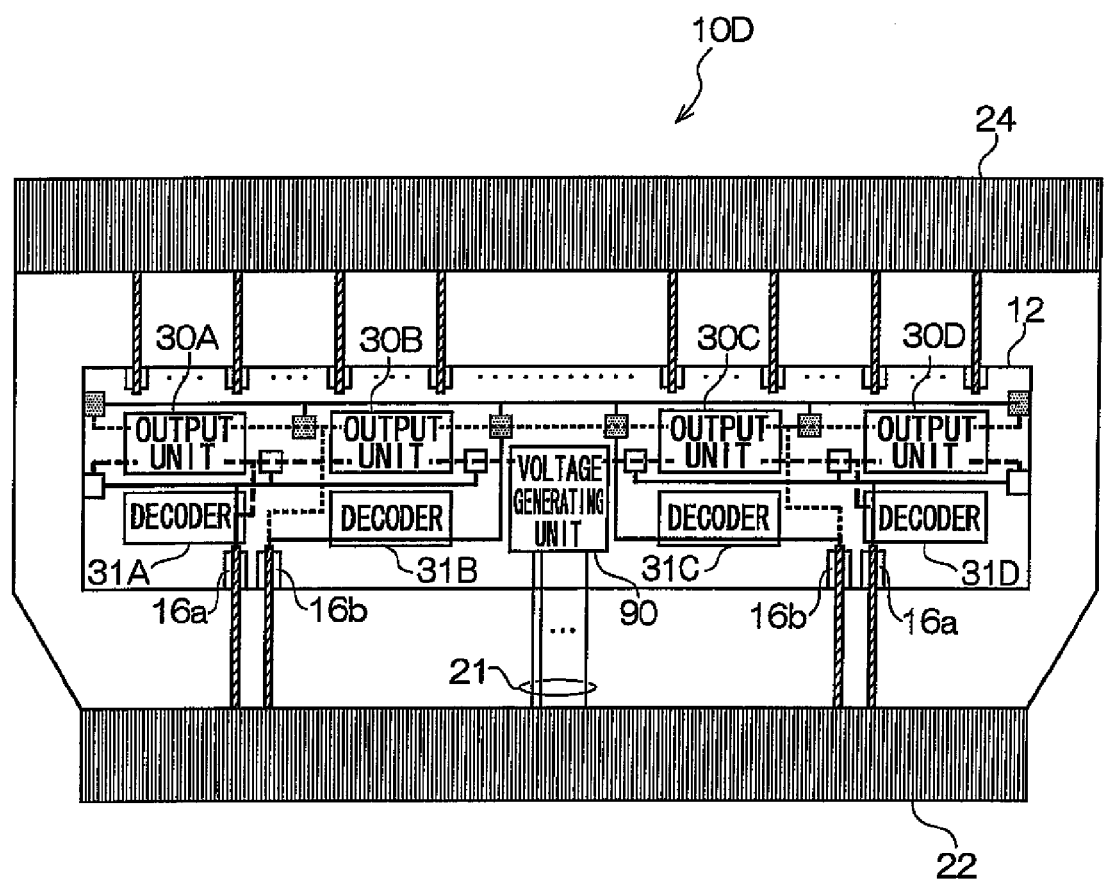
FIG. 7 is a plan view showing a schematic configuration of a semiconductor device according to a fourth embodiment of the invention.

FIG. 7 shows a schematic configuration of a semiconductor device 10D according to a fourth embodiment of the invention fabricated as a display driver using the COF method. Components identical between FIG. 7 and FIG. 1 are indicated by reference numerals used in FIG. 1 and will not be described here.

As shown in FIG. 7, the semiconductor device 10D of the present embodiment has a voltage generating unit 90 which is provided substantially in the middle of a semiconductor element 12 when viewed in the longitudinal direction of the element.

The voltage generating unit 90 generates a plurality of grayscale voltages by dividing a reference voltage applied through input side outer leads 22, a connection pattern 21 for a resistance ladder, and a metal pattern 54 using the resistance ladder.

In the semiconductor device 10D of the present embodiment, a terminal electrode is provided in the neighborhood of the resistance ladder instead of providing a terminal electrode for the resistance ladder in a peripheral part of the semiconductor element 12. The terminal electrode and the input side outer leads 22 are directly connected to an insulating film 18 through the connection pattern 21 for the resistance ladder and the metal pattern 54. Thus, the semiconductor element 12 can be provided with a size smaller than that in the case that the terminal electrode for the resistance ladder is provided at a peripheral part of the semiconductor element 12.

Each of decoders 31A to 31D shown in FIG. 7 is associated with any of semiconductor element internal output units 30A to 30D in a one-to-one relationship, and the decoders generate signals to be used by the respective semiconductor element internal output units using grayscale voltages generated by the voltage generating unit 90.

Figure 8:
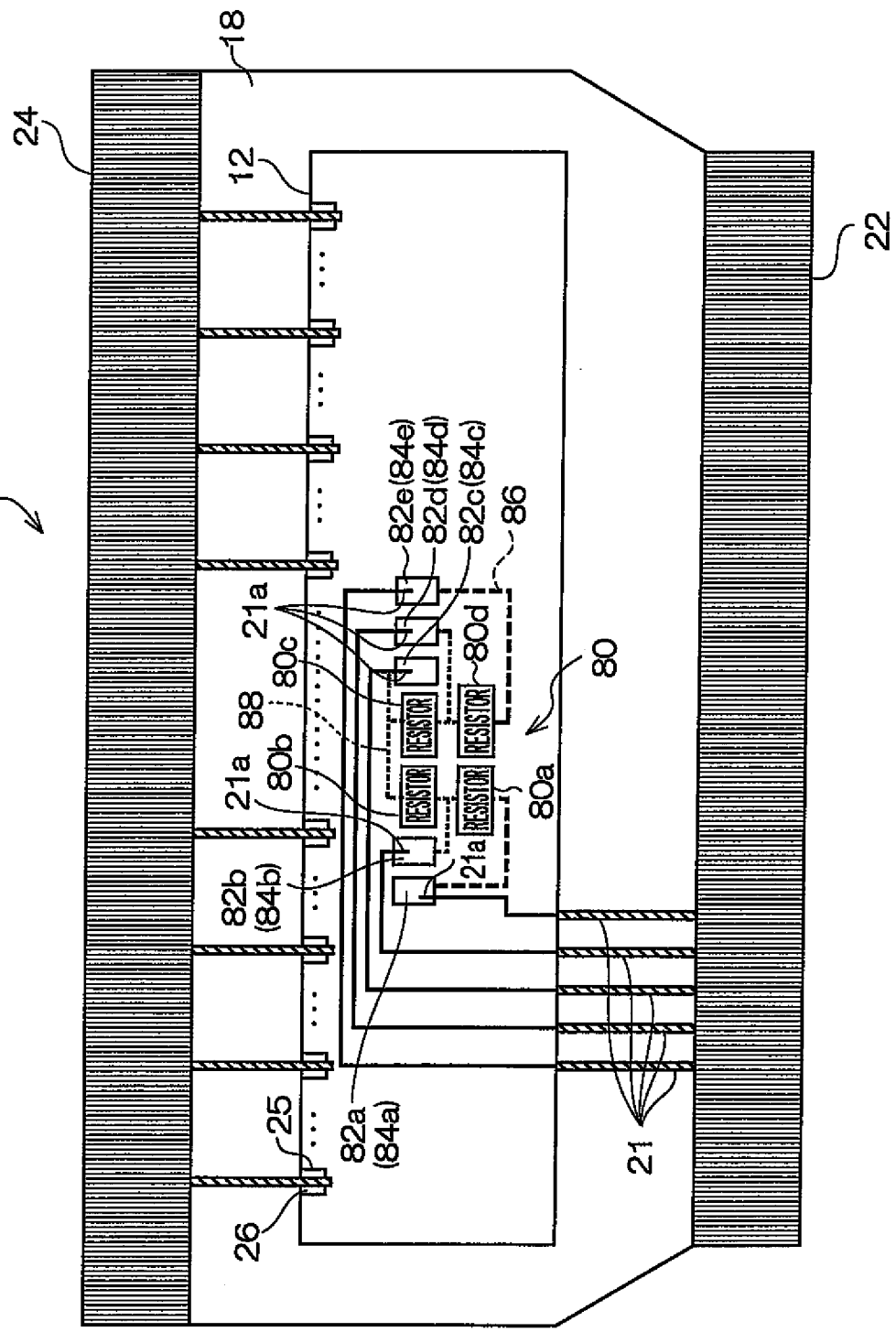
FIG. 8 is a plan view showing a detailed configuration of the semiconductor device according to the fourth embodiment.

FIG. 8 shows a detailed configuration of the voltage generating unit 90. Components identical between FIG. 8 and FIG. 1 are indicated by the reference numerals used in FIG. 1 and will not be described here.

As shown in FIG. 8, the voltage generating unit 90 includes a resistance ladder 80 which is formed by series-connecting resistors 80a, 80b, 80c, and 80d disposed in respective predetermined positions and which generates a grayscale voltage to serve as a reference for an output voltage to be output from the semiconductor element 12 to a display.

The voltage generating unit 90 includes five resistance ladder electrodes 82a, 82b, 82c, 82d, and 82e formed in the neighborhood of the resistance ladder 80. The voltage generating unit 90 also includes semiconductor element internal wirings 86 for connecting the resistance ladder electrode 82a and the resistance ladder electrode 82e with the ends of the series connection of the resistance ladder 80 and includes a semiconductor element internal wiring 88 for connecting the resistance ladder electrodes 82b to 82d with intermediate connecting parts of the series connection of the resistance ladder 80. An Au (gold) bump 84a, an Au bump 84b, an Au bump 84c, an Au bump 84d, and an Au bump 84e are provided on a surface of the resistance ladder electrode 82a, a surface of the resistance ladder electrode 82b, a surface of the resistance ladder electrode 82c, a surface of the resistance ladder 82d, and a surface of the resistance ladder electrode 82e, respectively.

The insulating film 18 includes resistance ladder connection nodes 21a which are formed in a mounting region and connected to the resistance ladder electrodes 82a, 82b, 82c, 82d, and 82d, respectively, and resistance ladder connection patterns 21 and metal wiring patterns 54 which are formed to extend from a non-mounting region into the mounting region for connecting the input side outer leads 22 and the resistance ladder connection nodes 21a.

Signals are input to the semiconductor device 10D through the input side outer leads 22 and subjected to predetermined conversion in the semiconductor element 12, and the converted signals are output through output side outer leads 24. In order to avoid confusion, FIG. 8 shows only the resistance ladder 80 among circuits in the semiconductor element 12, and other internal circuits (e.g., a logic unit, a level conversion unit, a latch unit, a D-A conversion unit, and a grayscale voltage generating unit) are omitted in the illustration.

As thus described, in the present embodiment, the Au bumps 84a to 84e and the resistance ladder electrodes 82a to 82e provided under the respective bumps are disposed in the neighborhood of the resistance ladder 80 in connection with the respective resistors, and the metal wiring patterns 54 on the semiconductor element are routed to make a detour such that the state of connection between the input side outer leads 22 and the Au bumps 84a to 84e will not be changed. Thus, the physical distance between the resistance ladder 80 and the Au bumps 84a to 84e can be kept small, and the impedance of the semiconductor element internal wirings 86 and the semiconductor element internal wiring 88 can be made small. As a result, the semiconductor element internal wirings 86 and the semiconductor element internal wiring 88 can be laid to occupy a small area. That is, the surface area of the semiconductor element 12 can be made small. In other words, a reference voltage input to the voltage generating unit 90 for generating voltages to serve as a basis for voltages output by the semiconductor element internal output units 30 can be supplied with less fluctuation. Further, the contribution to reduction in the wiring area in the semiconductor element allows the surface area of the semiconductor element to be reduced.

The invention has been described above with reference to embodiments of the same, but the technical scope of the invention is not limited to the above description of the embodiments. The embodiments may be variously altered or modified without departing from the spirit of the invention, and such alterations and modifications are also included in the technical scope of the invention.

The above-described embodiments are not limiting the invention set forth in the appended claims, and not all combinations of the features described in the embodiments constitute essential solving means of the invention. The above-described embodiments include various aspects of the invention, and it is therefore possible to extract the various aspects of the invention by combining the plurality of constituent features disclosed herein appropriately. Even when some of the constituent features disclosed in the embodiments are deleted, the configuration lacking those constituent features can be still extracted as an aspect of the invention as long as it provides the advantages of the invention.

Figure 9:
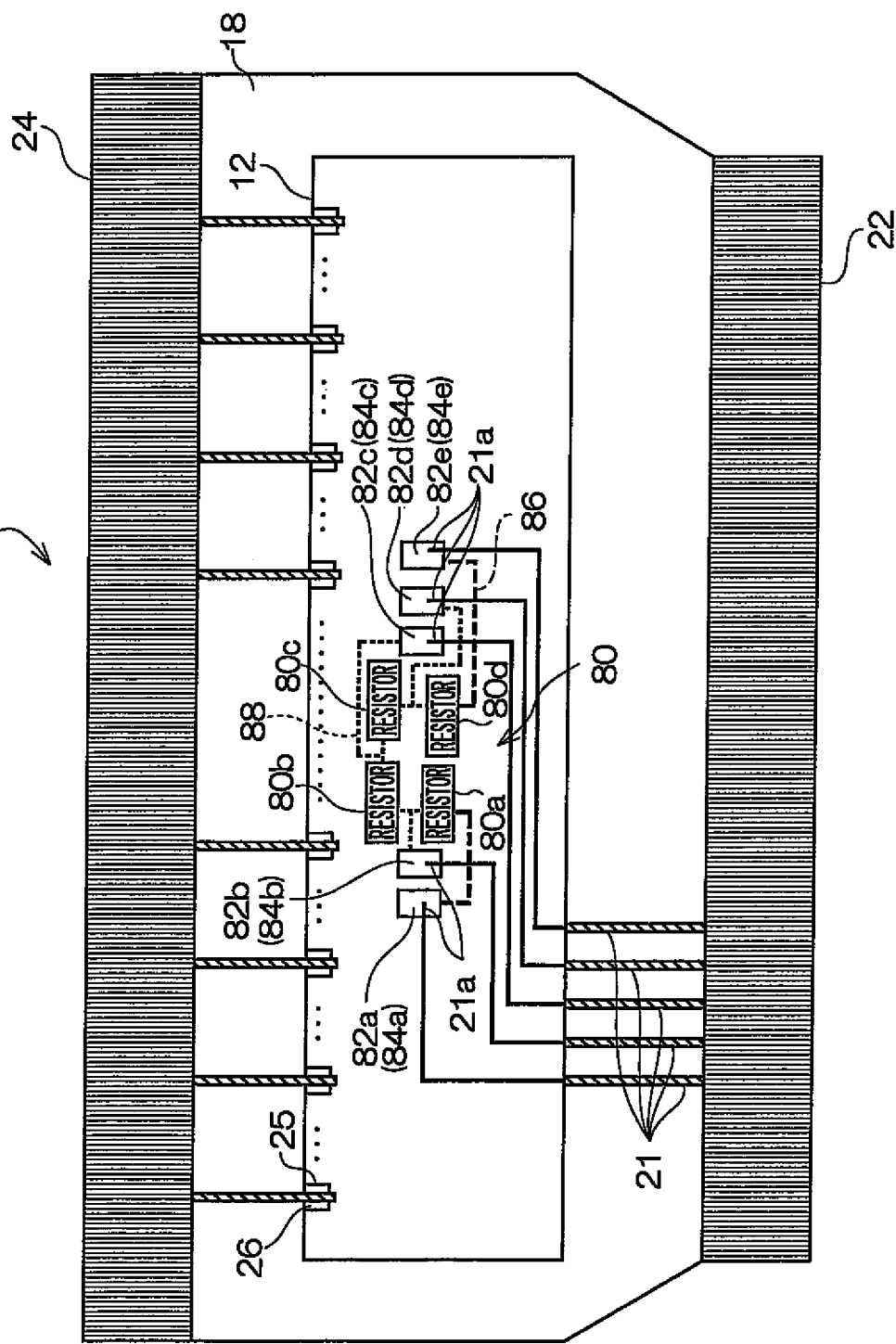
FIG. 9 is a plan view of a modification of the semiconductor device according to the fourth embodiment.
Figure 10:
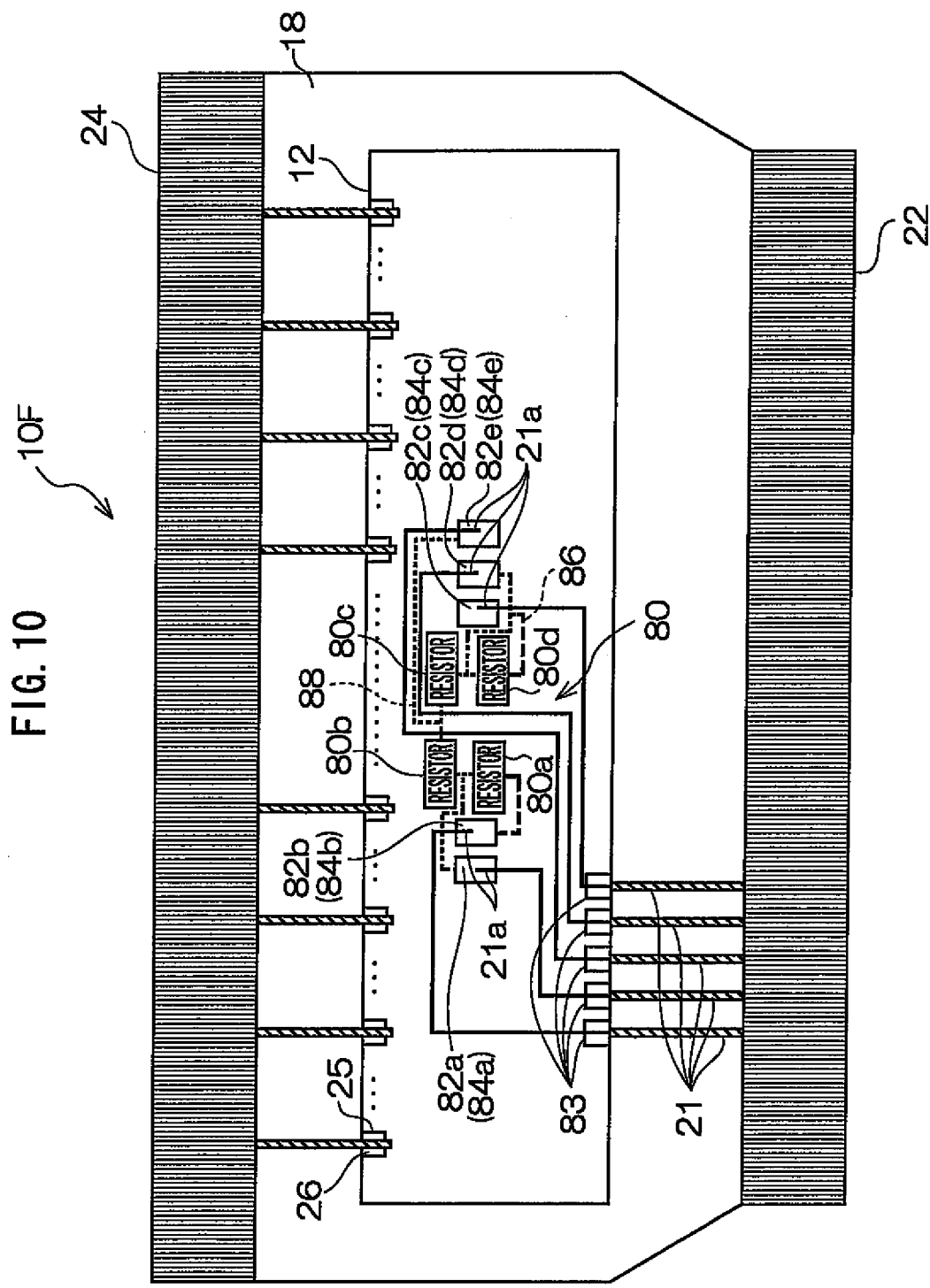
FIG. 10 is a plan view of anther modification of the semiconductor device according to the fourth embodiment.

For example, the fourth embodiment has been described as a case in which a semiconductor device 10D as shown in FIG. 8 is used as a semiconductor device according to the invention by way of example. The invention is not limited to the same, and the device may be replaced by, for example, a semiconductor device 10E as shown in FIG. 9 or a semiconductor device 10F as shown in FIG. 10. FIG. 10 is different from FIGS. 8 and 9 in that reference voltage input electrodes 83 are provided. It is desirable to exclude the reference voltage input electrodes 83 because the surface area of the device can be smaller when there is no need for the area to accommodate the electrodes 83, and FIG. 10 may be understood as showing that the possibility of the provision of such electrodes is not eliminated where they are required. In FIGS. 9 and 10, the elements having the same functions as those shown in FIG. 8 are given the same reference numerals as in FIG. 8. The same advantages as those of the fourth embodiment can be achieved also in these cases.

Obviously, the first to fourth embodiments may be implemented in combination.

Figure 11:
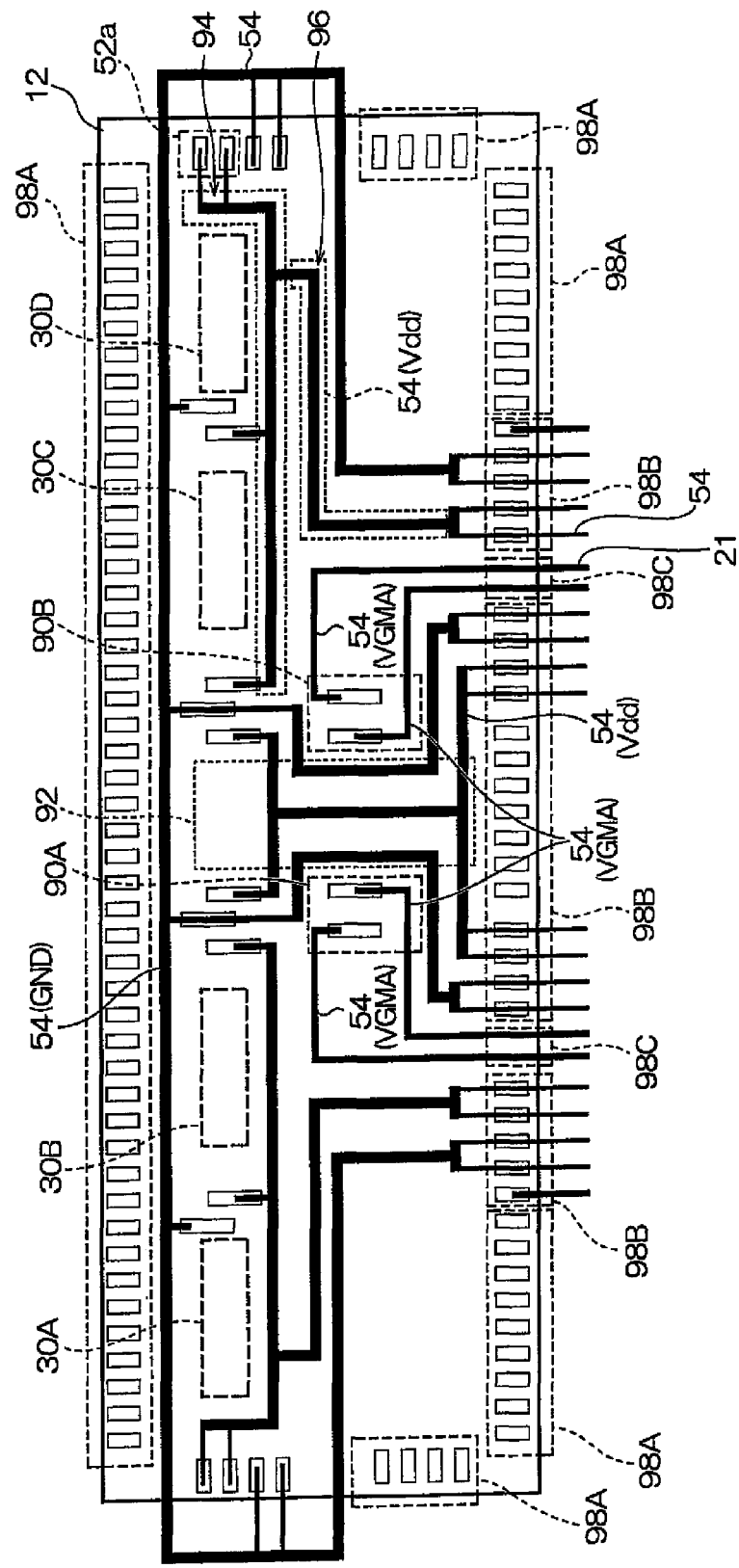
FIG. 11 is a plan view showing an example of a combination of a plurality of the embodiments of a semiconductor device.

FIG. 11 shows an example of a configuration of a semiconductor device which is a combination of the third and fourth embodiments. Although FIG. 11 shows no tape substrate, it is assumed that all wirings shown in the figure are formed on a tape substrate.

As shown in FIG. 11, in this exemplary configuration, two voltage generating units 90, i.e., a voltage generating unit 90A and a voltage generating unit 90B are provided. Details of the voltage generating units 90 are as shown in FIGS. 8 to 10. A region 92 between the voltage generating unit 90A and the voltage generating unit 90B is a region where functional blocks excluding output units 30 and the voltage generating units 90 are disposed.

Each of semiconductor element internal output units 30A to 30D outputs a grayscale voltage which has been selected by either P decoder constituted by a P-channel MOSFET or N decoder constituted by an N-channel MOSFET. The voltage generating unit 90A generates grayscale voltages to be input to the decoder constituted by a P-channel MOSFET, and the voltage generating unit 90B generates grayscale voltages to be input to the decoder constituted by an N-channel MOSFET.

In the case of a driver capable of displaying eight bits of data (256 grayscales), each of the voltage generating units 90A and 90B generates voltages to render 256 grayscales, and nine or eleven reference voltages are supplied to each unit.

The semiconductor element 12 includes three types of regions provided along a first edge of the same, i.e., regions 98A having output electrode formed therein, regions 98B having input electrodes formed therein, and regions 98C having no input electrode formed therein. The regions 98C without input electrode are provided between the input electrode regions 98B. Particularly, the regions 98C without input electrode are provided between first electrodes (ground terminal electrodes or power supply terminal electrodes) provided at the input electrode regions 98B. In this case, an input side outer lead and an electrode 82 for a resistance ladder are connected by a metal wiring pattern 54 (VGMA) through a region on the substrate associated with a region 98C without input electrode.

Metal wiring patterns 54 shown in FIG. 11 have unique shapes. A structure of a metal wiring pattern 54 (Vdd) connecting power supply terminal electrodes 14a and power supply terminal electrodes 52 will now be particularly described. The metal wiring pattern 54 (Vdd) is constituted by a common connection unit 94 for connecting each of the power supply terminal electrodes 52 disposed in the neighborhood of an output unit 30 in common and an impedance adjusting unit 96 for connecting the power supply terminal electrodes 14a and the common connection unit 94 to adjust the impedance of the internal power supply wiring. The impedance adjusting unit 96 is connected to the common connection unit 94 at a point close to the power supply terminal electrode 52a closest to a corner of the semiconductor element 12 instead of connecting them by the shortest route. In other words, the point of connection to the common connection unit 94 is made close to the output unit 30D (or the output unit 30A on the left side of the semiconductor element 12) among the output units 30 which is located at a longitudinal end of the semiconductor element 12. The use of this configuration allows the supply of power to be kept a higher level of evenness between the output units 30C and 30D.

The first and fourth embodiments can be implemented in a combined form as shown in FIG. 11 by providing wiring patterns 54 corresponding to those in the first embodiment using either of the two power supply electrode pairs disposed on the left and right sides of the semiconductor element 12.

Similarly, a plurality of embodiments among the first to third embodiments may be implemented in combination. In such a case, the combined embodiment has all advantages provided by the original embodiments.

The numbers of various Au bumps shown in the above-described embodiments are merely examples, and the bumps may obviously be provided in different quantities. The same advantages as those of the above embodiments can be achieved also in such a case.

Although no particular mention has been made of display apparatus to which the embodiments apply, the invention can be used for various displays including liquid crystal displays, plasma displays, and organic EL displays.

While the above embodiments have been described as cases wherein Au is used as the material of bumps, other metals may obviously be used instead.

The first to third embodiments have been described as cases wherein a semiconductor element internal output unit is divided into four blocks, i.e., semiconductor element internal output units 30A to 30D. The invention is not limited to such a configuration, and the output unit may obviously be divided into a different number of blocks. The same advantages as those of the above embodiments can be achieved also in such a case.

The fourth embodiment has been described as a case wherein a resistance ladder is divided into four blocks. The invention is not limited to such a configuration, and the resistance ladder may obviously be divided into a different number of blocks. The same advantages as those of the fourth embodiment can be achieved also in such a case.

A semiconductor device and a substrate according to the invention are advantageous in that a semiconductor element can be made compact and designed efficiently while maintaining the performance of the element, in particular, power supplying capability.

What is claimed is:

1. A semiconductor device having a rectangular semiconductor element mounted on a substrate formed with an external input terminal, an external output terminal, and a plurality of wiring patterns connected to each of the external input terminal and the external output terminal, wherein, the semiconductor element comprises:
a plurality of first electrodes formed along a first edge of the semiconductor element;
a plurality of second electrodes formed along a second edge opposite to the first edge of the semiconductor element;
a plurality of third electrodes formed in a neighborhood of a functional block; and
an internal wiring for connecting each of the first electrodes with the third electrodes, and the substrate comprises
a first wiring pattern for connecting the external input terminal and the first electrodes;
a second wiring pattern for connecting the external output terminal and the second electrodes; and
a third wiring pattern for connecting the first electrodes with the third electrodes,
wherein for each first electrode, there is at least one corresponding third electrode such that a first wiring path and a second wiring path connect between said first electrode and said at least one corresponding third electrode, the first wiring path being part of the internal wiring of the semiconductor element and the second wiring path being part of the third wiring pattern of the substrate.

2. The semiconductor device according to claim 1, wherein each of the first electrodes corresponds to more than one of the third electrodes.

3. The semiconductor device according to claim 1, wherein the third wiring pattern includes a branching point to connect between one of the first electrodes with more than one of the third electrodes and the internal wiring includes a branching point to connect between one of the first electrodes with more than one of the third electrodes.

4. The semiconductor device according to claim 1, wherein the semiconductor element is an IC driver which drives a display.

5. The semiconductor device according to claim 1, wherein the substrate is a tape substrate.

6. The semiconductor device according to claim 1, wherein:
the plurality of first electrodes include a first power supply electrode and a first ground electrode;
the plurality of third electrodes include a second power supply electrode and a second ground electrode; and
the functional block is an output unit at which an operational amplifier is formed.

7. The semiconductor device according to claim 6, wherein the second power supply electrode and the second ground electrode are formed at a periphery of the output unit.

8. The semiconductor device according to claim 6, wherein the second power supply electrode is formed between the output unit and the second electrodes.

9. The semiconductor device according to claim 6, comprising a plurality of the second power supply electrodes or the second ground electrodes, wherein connections between second power supply electrodes associated with each other or between second ground electrodes associated with each other are provided by the third wiring pattern.

10. The semiconductor device according to claim 9, wherein the third wiring pattern connecting the second power supply electrodes or the second ground electrodes is disposed to extend linearly in a longitudinal direction of the semiconductor element.

11. The semiconductor device according to claim 9, wherein the third wiring pattern connecting the second power supply electrodes and the third wiring pattern connecting the second ground terminals are disposed to sandwich the output unit therebetween.

12. The semiconductor device according to claim 9, wherein:
the internal wiring includes an internal power supply wiring and an internal ground wiring extending in a longitudinal direction of the semiconductor element; and
the third wiring pattern connecting the second power supply electrodes and the third wiring pattern connecting the second ground terminals are disposed to avoid regions at which the internal power supply wiring and the internal ground wiring are formed.

13. The semiconductor device according to claim 6, wherein the third wiring pattern connected to whichever of the first power supply electrode and the first ground electrode disposed along the first edge is closer to a central part of the first edge, connects to the third electrodes by extending through a central part of the semiconductor element.

* * * * *